United States Patent
Kadota et al.

(10) Patent No.: US 10,312,883 B2
(45) Date of Patent: Jun. 4, 2019

(54) ELASTIC WAVE DEVICE

(71) Applicant: Murata Manufacturing Co., Ltd., Nagaokakyo-shi, Kyoto-fu (JP)

(72) Inventors: Michio Kadota, Nagaokakyo (JP); Tetsuya Kimura, Nagaokakyo (JP); Kenya Hashimoto, Nagaokakyo (JP); Shuji Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 343 days.

(21) Appl. No.: 15/233,016

(22) Filed: Aug. 10, 2016

(65) Prior Publication Data
US 2016/0352304 A1 Dec. 1, 2016

Related U.S. Application Data (63) Continuation of application No. PCT/JP2015/054248, filed on Feb. 17, 2015.

(30) Foreign Application Priority Data

Mar. 14, 2014 (JP) ................................. 2014-051298

(51) Int. Cl.
*H03H 9/145* (2006.01)
*H03H 9/02* (2006.01)

(52) U.S. Cl.
CPC .... *H03H 9/14538* (2013.01); *H03H 9/02228* (2013.01); *H03H 9/02559* (2013.01)

(58) Field of Classification Search
CPC .. H03H 9/02228; H03H 9/02992; H03H 9/25; H03H 9/64; H03H 9/02559; H03H 9/14544
See application file for complete search history.

(56) References Cited

U.S. PATENT DOCUMENTS

| 8,610,518 B1* | 12/2013 | Solal ................... H03H 9/0066 310/313 B |
| 9,059,677 B2* | 6/2015 | Reinhardt ................ H03H 3/02 |
| 2007/0267942 A1 | 11/2007 | Matsumoto et al. |
| 2008/0106354 A1 | 5/2008 | Kando |

(Continued)

FOREIGN PATENT DOCUMENTS

| EP | 2 744 107 A1 | 6/2014 |
| JP | 2001-285021 A | 10/2001 |

(Continued)

OTHER PUBLICATIONS

English translation of Official Communication issued in corresponding International Application PCT/JP2015/054248, dated Apr. 21, 2015.

*Primary Examiner* — J. San Martin
(74) *Attorney, Agent, or Firm* — Keating & Bennett, LLP (57) ABSTRACT

An elastic wave device includes a first IDT electrode on a first main surface of a LiNbO$_3$ substrate, and a second IDT electrode on a second main surface thereof. The application of alternating voltages with reversed phases to each other to the first and second IDT electrodes excites plate waves in which SH waves in a high order mode predominate. The elastic wave device uses the plate waves in the high order mode in which the SH waves predominate.

17 Claims, 7 Drawing Sheets

(56) References Cited

U.S. PATENT DOCUMENTS

| | | | |
|---|---|---|---|
| 2009/0236935 A1* | 9/2009 | Kando | H03H 9/02055 310/313 R |
| 2010/0123367 A1* | 5/2010 | Tai | H03H 9/02228 310/313 B |
| 2014/0009032 A1 | 1/2014 | Takahashi et al. | |
| 2014/0145556 A1* | 5/2014 | Kadota | H03H 9/02228 310/313 A |
| 2014/0152146 A1 | 6/2014 | Kimura et al. | |

FOREIGN PATENT DOCUMENTS

| | | |
|---|---|---|
| JP | 2005-217818 A | 8/2005 |
| JP | 2007-312164 A | 11/2007 |
| JP | 2010-154505 A | 7/2010 |
| JP | 2010-220204 A | 9/2010 |
| WO | 2007/007462 A1 | 1/2007 |
| WO | 2012/086441 A1 | 6/2012 |
| WO | 2013/021948 A1 | 2/2013 |

* cited by examiner

S₀ MODE LAMB WAVE

FIG. 2B

S₁ MODE LAMB WAVE

FIG. 2C

A₀ MODE LAMB WAVE

FIG. 2D

A₁ MODE LAMB WAVE

FIG. 2E

SH₀ MODE

FIG. 2F

SH₁ MODE

ELASTIC WAVE DEVICE

CROSS REFERENCE TO RELATED APPLICATIONS

This application claims the benefit of priority to Japanese Patent Application 2014-051298 filed Mar. 14, 2014 and is a Continuation Application of PCT/JP2015/054248 filed on Feb. 17, 2015, the entire contents of each application are hereby incorporated herein by reference.

BACKGROUND OF THE INVENTION

1. Field of the Invention

The present invention relates to an elastic wave device including a $LiNbO_3$ substrate with elastic waves, and preferably plate waves, propagating through the $LiNbO_3$ substrate.

2. Description of the Related Art

Various elastic wave devices have been proposed. In an elastic wave device described in International Publication No. WO2013/021948 A1 uses a $LiNbO_3$ substrate. On both surfaces of the $LiNbO_3$ substrate, IDT (interdigital transducer) electrodes are provided. Alternating voltages of the same phase are applied to the IDT electrodes provided on both the surfaces. SH waves in a zero order mode are used thereby as plate waves.

Japanese Unexamined Patent Application Publication No. 2010-220204 discloses a Lamb wave device using a piezoelectric thin film made of $LiNbO_3$. Also in the Japanese Unexamined Patent Application Publication No. 2010-220204, IDT electrodes are formed on both surfaces of the $LiNbO_3$. Japanese Unexamined Patent Application Publication No. 2010-220204 also discloses a structure in which an IDT electrode is provided on one surface of the piezoelectric thin film, and another electrode made of a metal film is provided on the other surface so as to be opposed to the IDT electrode. According to Japanese Unexamined Patent Application Publication No. 2010-220204, waves in a high-order mode having an acoustic velocity of 5000 m/second or more are excited as Lamb waves in the piezoelectric thin film.

In the elastic wave device described in International Publication No. WO2013/021948 A1, the IDT electrodes are formed on both the surfaces of the $LiNbO_3$ substrate. This allows an increase in an electromechanical coupling coefficient of the SH waves in the zero order mode. Thus, a fractional bandwidth is increased.

However, an acoustic velocity is low, e.g., 3000 m/s to 4000 m/second. To increase a frequency, a wavelength $\lambda$ is required to be short. Therefore, it becomes difficult to form the IDT electrodes and the like.

On the other hand, in the elastic wave device according to Japanese Unexamined Patent Application Publication No. 2010-220204, a high acoustic velocity of 5000 m/second or more is obtained. Thus, a high frequency is easily obtained. However, Japanese Unexamined Patent Application Publication No. 2010-220204 does not describe a structure in which a wide bandwidth and a high acoustic velocity are compatible.

SUMMARY OF THE INVENTION

Preferred embodiments of the present invention provide an elastic wave device in which a high acoustic velocity and a high fractional bandwidth are compatible and achieved.

An elastic wave device according to a preferred embodiment of the present invention includes a $LiNbO_3$ substrate including a first main surface and a second main surface on an opposite side of the first main surface; a first IDT electrode provided on the first main surface of the $LiNbO_3$ substrate; and a second IDT electrode provided on the second main surface of the $LiNbO_3$ substrate so as to be opposed to the first IDT electrode across the $LiNbO_3$ substrate. When alternating voltages of reversed phases to each other are applied to the first IDT electrode and the second IDT electrode, plate waves in a high order mode in which SH waves predominate are excited in the $LiNbO_3$ substrate as elastic waves.

In a specific aspect of an elastic wave device according to a preferred embodiment of the present invention, in the Euler angles ($\phi$, $\theta$, $\psi$) of the $LiNbO_3$ substrate, $\phi=0\pm5°$, $\psi=0\pm5°$, and $\theta$ is about 72° or more and about 97° or less, for example.

In another specific aspect of an elastic wave device according to a preferred embodiment of the present invention, the thickness of the $LiNbO_3$ substrate is about $0.05\lambda$ or more and about $0.52\lambda$ or less, when $\lambda$ represents a wavelength determined by the pitch of electrode fingers of the first and second IDT electrodes.

In another specific aspect of an elastic wave device according to a preferred embodiment of the present invention, the duty of each of the first and second IDT electrodes is about 0.15 or more and about 0.77 or less.

In yet another specific aspect of an elastic wave device according to a preferred embodiment of the present invention, the first and second IDT electrodes each include an electrode film made of Al or an alloy having Al as a main constituent, and the film thickness of each of the electrode films is about $0.035\lambda$ or less when $\lambda$ represents a wavelength determined by the pitch of electrode fingers of the first and second IDT electrodes.

An elastic wave device according to another preferred embodiment of the present invention includes a $LiNbO_3$ substrate including a first main surface and a second main surface on an opposite side of the first main surface; an IDT electrode provided on the first main surface of the $LiNbO_3$ substrate; and an electrode film provided on the second main surface of the $LiNbO_3$ substrate so as to occupy an entire area enclosed with outer edges of the IDT electrode in a plan view from the side of the first main surface. When an alternating voltage is applied to the IDT electrode, plate waves in a high order mode in which SH waves predominate are excited in the $LiNbO_3$ substrate as elastic waves.

In a specific aspect of an elastic wave device according to a preferred embodiment of the present invention, in the Euler angles ($\phi$, $\theta$, $\psi$) of the $LiNbO_3$ substrate, $\phi=0\pm5°$, $\psi=0\pm5°$, and $\theta$ is about 68° or more and about 96° or less.

In another specific aspect of an elastic wave device according to a preferred embodiment of the present invention, the thickness of the $LiNbO_3$ substrate is about $0.05\lambda$ or more and about $0.18\lambda$ or less, when $\lambda$ represents a wavelength determined by the pitch of electrode fingers of the IDT electrode.

In yet another specific aspect of an elastic wave device according to a preferred embodiment of the present invention, the duty of the IDT electrode is about 0.1 or more and about 0.68 or less.

In yet another specific aspect of an elastic wave device according to a preferred embodiment of the present invention, the IDT electrode includes an electrode film made of Al or an alloy having Al as a main constituent, and the film thickness of the electrode film is about $0.022\lambda$ or less when $\lambda$ represents a wavelength determined by the pitch of electrode fingers of the IDT electrode.

According to various preferred embodiments of the present invention, the use of the plate waves in the high order mode in which the SH waves predominate achieves an increase in an acoustic velocity. Furthermore, preferred embodiments of the present invention also achieve an increase in a fractional bandwidth. Therefore, in the elastic wave devices using the plate waves according to preferred embodiments of the present invention, a high acoustic velocity and a high fractional bandwidth are compatible and achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention. It is noted that each preferred embodiment described in this specification is just an example, and components or elements can be partly substituted or combined between the different preferred embodiments.

Figure 1A:
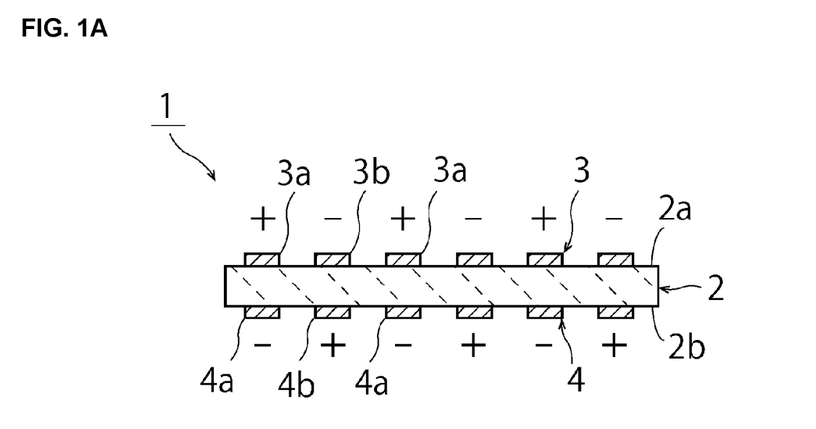
FIG. 1A is a front sectional view of an elastic wave device according to a first preferred embodiment of the present invention.
Figure 1B:
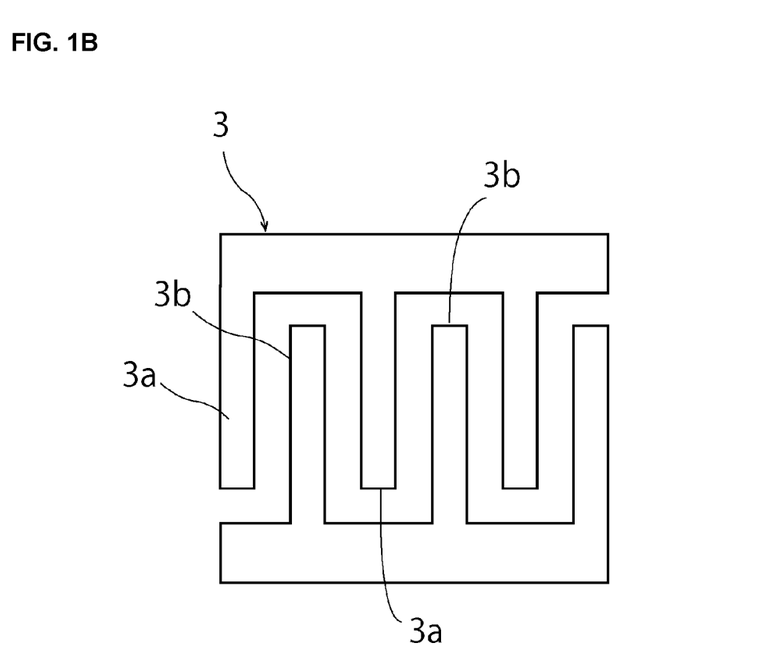
FIG. 1B is a schematic plan view showing the structure of an electrode thereof.

FIG. 1A is a front sectional view of an elastic wave device according to a first preferred embodiment of the present invention, and FIG. 1B is a schematic plan view showing the structure of an electrode thereof.

An elastic wave device 1 includes a $LiNbO_3$ substrate 2. The Euler angles of the $LiNbO_3$ substrate 2 are hereinafter represented by ($\phi$, $\theta$, $\psi$). The Euler angles are preferably within the range of ($0\pm5°$, $\theta$, $0\pm5°$). In this range, SH waves, as plate waves, are efficiently excited. The $LiNbO_3$ substrate 2 includes a first main surface 2a and a second main surface 2b on the opposite side of the first main surface 2a.

On the first main surface 2a, a first IDT electrode 3 is provided. FIG. 1B shows the structure of the first IDT electrode 3. The first IDT electrode 3 includes a plurality of electrode fingers 3a and a plurality of electrode fingers 3b. The plurality of electrode fingers 3a and the plurality of electrode fingers 3b are interposed with one another.

On the second main surface 2b, a second IDT electrode 4 is provided. In a planar view, the second IDT electrode 4 preferably has the same or substantially the same shape as the first IDT electrode 3. Electrode fingers 4a and 4b of the second IDT electrode 4 are opposed to the electrode fingers 3a and 3b of the first IDT electrode 3 across the $LiNbO_3$ substrate 2. The IDT electrode 3 and the IDT electrode 4 are driven by applying alternating voltages of reversed phases to each other.

The IDT electrodes 3 and 4 are preferably made of Al in this preferred embodiment. Alternatively, an alloy including Al as a main constituent may be used. Here, having Al as the main constituent means that the IDT electrodes 3 and 4 are made of an Al alloy of about 50 weight % or more. The IDT electrodes 3 and 4 may have a multilayer structure of an Al film and another metal film.

In this preferred embodiment, the application of the alternating voltages of the reversed phases to each other to the IDT electrode 3 and the IDT electrode 4 effectively excites SH waves in a first order mode, as plate waves to be used. Note that, the SH waves in the first order mode correspond to the plate waves in a high order mode in which the SH waves predominate.

It is noted that in this specification, the plate waves in the high order mode in which the SH waves predominate include the SH waves in the first order mode and SH waves in higher order modes than the first order mode. In other words, plate waves in higher order modes than a zero order mode, which is a basic mode of the SH waves, are referred to as the plate waves in the high order mode in which the SH waves predominate. The reason why the SH waves are referred to as "predominating" is that the excited plate waves include components other than the SH waves. "Predominating" indicates that an SH wave component occupies about 50% or more of vibrational energy in the above excited mode.

Figure 2A:
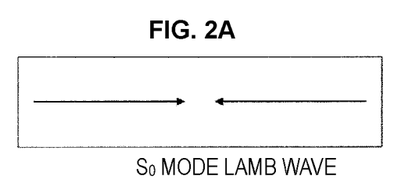
FIGS. 2A to 2F are schematic views that explain an $S_0$ mode, an $S_1$ mode, an $A_0$ mode, an $A_1$ mode, an $SH_0$ mode, and an $SH_1$ mode, respectively.
Figure 2B:
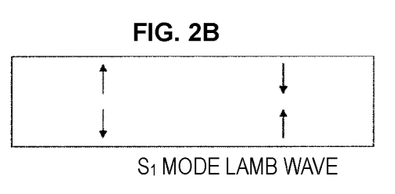
Figure 2C:
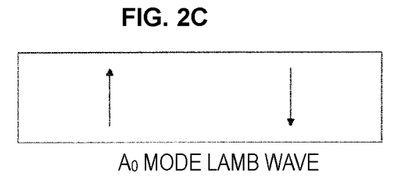
Figure 2D:
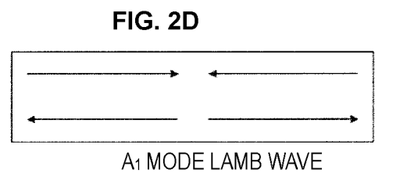
Figure 2E:
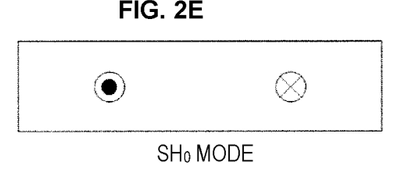
Figure 2F:
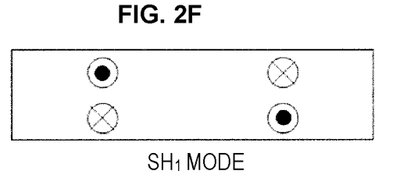

Note that, plate waves are classified into Lamb waves (predominantly including components in a propagation direction of elastic waves and a piezoelectric thickness direction) and SH waves (predominantly include SH components) according to their displacement components. Moreover, the Lamb waves are classified into a symmetric mode (S mode) and an anti-symmetric mode (A mode). In the symmetric mode, displacements coincide with respect to a half line in the thickness of a piezoelectric body. In the anti-symmetric mode, displacements are opposite in direction. Numerical subscripts indicate the number of nodes in the thickness direction. Here, an A1 mode Lamb wave refers to a Lamb wave in a first order anti-symmetric mode. FIGS. 2A-2F show the S modes and the A modes of the Lamb waves and propagation modes of the SH waves. In FIGS. 2A to 2D, arrows indicate the displacement directions of the elastic waves. In FIGS. 2E and 2F, the directions perpendicular or substantially perpendicular to the plane of paper correspond to the displacement directions of the elastic waves. The SH wave in a zero order mode as shown in FIG. 2E is a basic wave of the SH waves, and this preferred embodiment uses the SH waves in the first order mode as shown in FIG. 2F.

Figure 3:
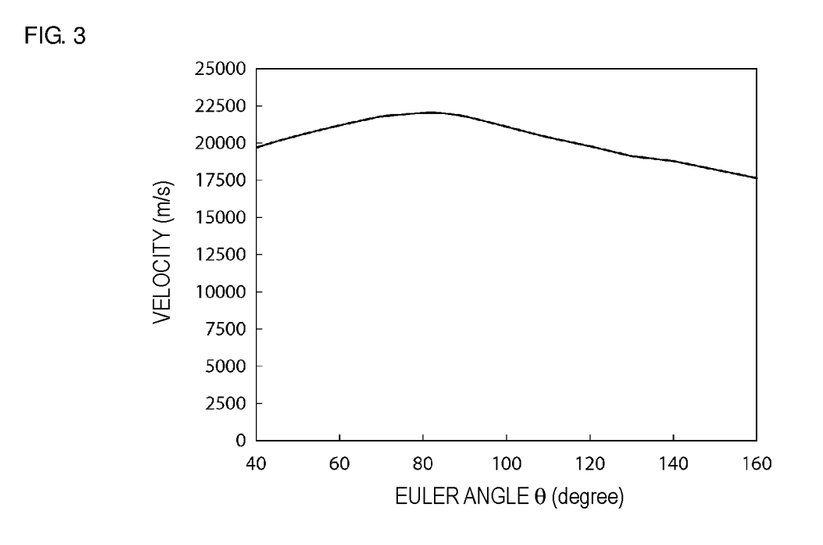
FIG. 3 is a graph showing the relationship between an Euler angle $\theta$ and the acoustic velocity of SH waves in a first order mode in the elastic wave device according to the first preferred embodiment of the present invention.

FIG. 3 is a graph that shows variations in the acoustic velocity of the SH waves in the first order mode, when varying θ of the Euler angles (0°, θ, 0°) of the LiNbO$_3$ substrate 2. Here, the thickness of the LiNbO$_3$ substrate was set at about 0.1λ, where λ represented a wavelength determined by the pitch of the electrode fingers. The IDT electrodes had a film thickness of about 0.01λ and a duty of about 0.3.

As is apparent from FIG. 3, a high acoustic velocity of about 17500 m/second or more is realized when the Euler angle θ is between about 40° and about 160° inclusive.

Figure 4:
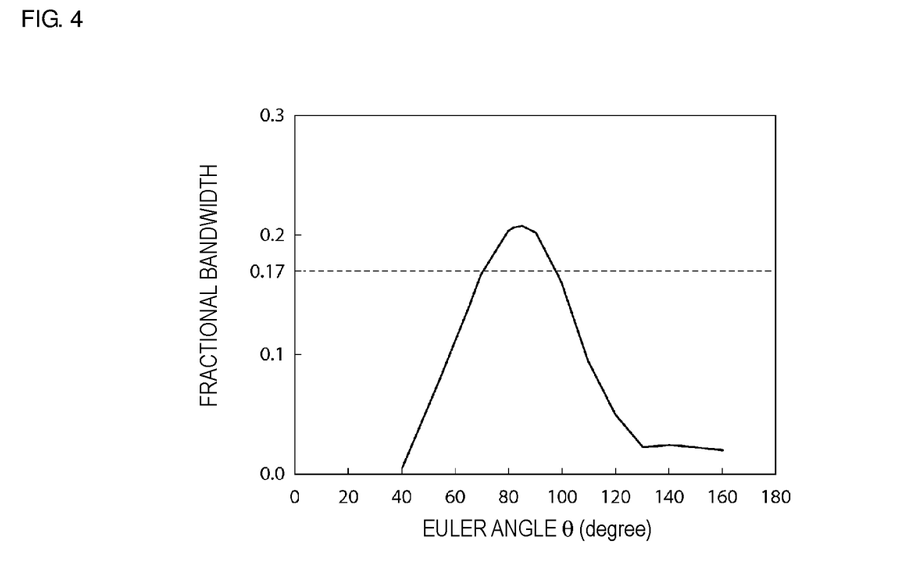
FIG. 4 is a graph showing the relationship between the Euler angle $\theta$ and a fractional bandwidth in the elastic wave device according to the first preferred embodiment of the present invention.

FIG. 4 is a graph showing the relationship between the Euler angle θ and a fractional bandwidth in the elastic wave device having the same structure as above described. Here, the fractional bandwidth refers to the fraction, that is, the difference in frequency between an anti-resonant frequency and a resonant frequency is divided by the resonant frequency in a surface acoustic wave resonator.

As is apparent from FIG. 4, when the Euler angle θ is about 72° or more and about 97° or less, the fractional bandwidth is about 0.17 or more, that is, about 17% or more. In current elastic wave devices, the fractional bandwidth is of the order of about 17% at the maximum. Therefore, it is discovered and confirmed that an Euler angle θ of about 72° or more and about 97° or less, as described above, allows a wide bandwidth.

The Euler angle θ is more preferably about 79° or more and about 91° or less. In this case, the fractional bandwidth becomes about 20% or more.

Figure 5:
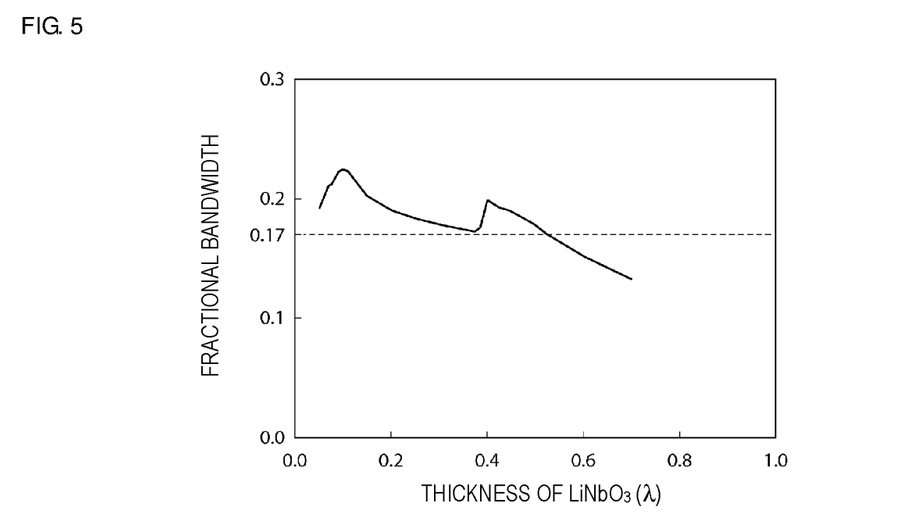
FIG. 5 is a graph showing the relationship between the thickness ($\times\lambda$) of a $LiNbO_3$ substrate and the fractional bandwidth in the elastic wave device according to the first preferred embodiment of the present invention.

FIG. 5 is a graph showing the relationship between the thickness (xλ) of the above LiNbO$_3$ substrate 2 and the fractional bandwidth. Note that, the Euler angles were here set at (0°, 83°, 0°). The IDT electrodes had a film thickness of about 0.01λ and a duty of about 0.3.

As is apparent from FIG. 5, when the thickness of the LiNbO$_3$ substrate 2 is about 0.05λ or more and about 0.52λ or less, the fractional bandwidth can be about 0.17 or more, that is, about 17% or more. The thickness of the LiNbO$_3$ substrate 2 is preferably 0.07λ or more and 0.17λ or less. In this case, the fractional bandwidth can be about 20% or more.

Figure 6:
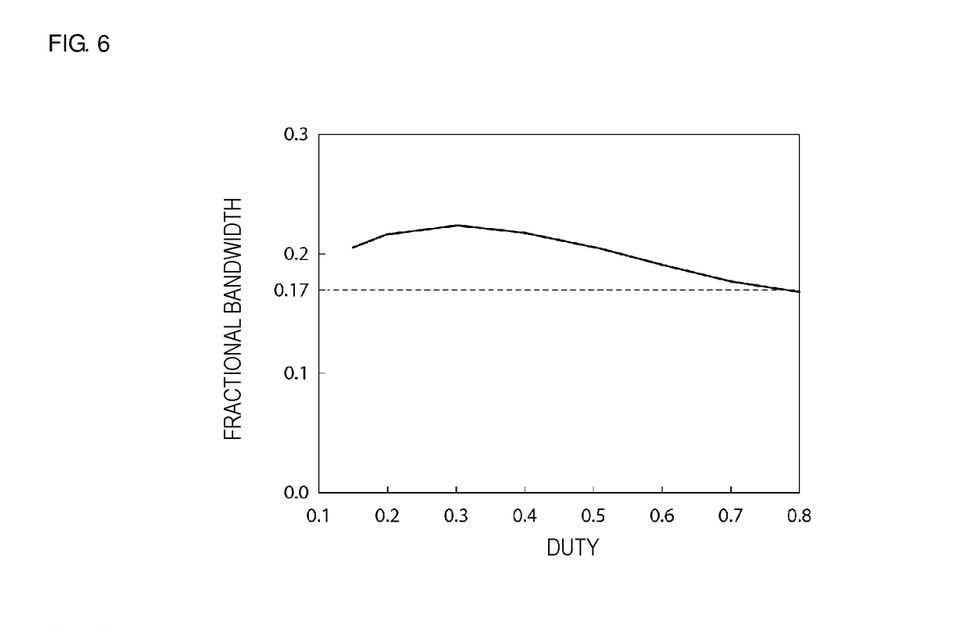
FIG. 6 is a graph showing the relationship between the duty of an IDT electrode and the fractional bandwidth in the elastic wave device according to the first preferred embodiment of the present invention.

FIG. 6 is a graph showing the relationship between the duty of the IDT electrodes and the fractional bandwidth. Here, the LiNbO$_3$ substrate had Euler angles of (0°, 83°, 0°) and a thickness of about 0.1λ. The IDT electrodes were made of an Al film and had a thickness of about 0.01λ.

As is apparent from FIG. 6, the duty is preferably set at about 0.15 or more and about 0.77 or less. Thus, the fractional bandwidth can be certainly 0.17 or more, that is, about 17% or more.

Figure 7:
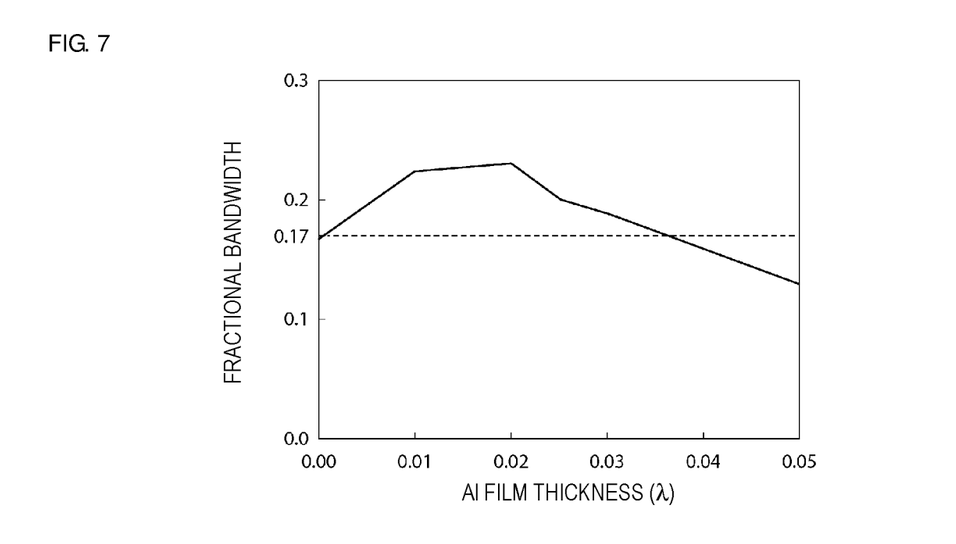
FIG. 7 is a graph showing the relationship between the film thickness ($\times\lambda$) of an Al film constituting the IDT electrode and the fractional bandwidth in the elastic wave device according to the first preferred embodiment of the present invention.

FIG. 7 is a graph showing the relationship between the film thickness (λ) of the IDT electrodes made of Al and the fractional bandwidth. Here, the LiNbO$_3$ substrate had Euler angles of (0°, 83°, 0°) and a thickness of about 0.1λ. The duty of the IDT electrodes was about 0.3.

As is apparent from FIG. 7, the film thickness of Al is preferably about 0.035λ or less. In this case, the fractional bandwidth can be about 0.17 or more, that is, about 17% or more.

Figure 8:
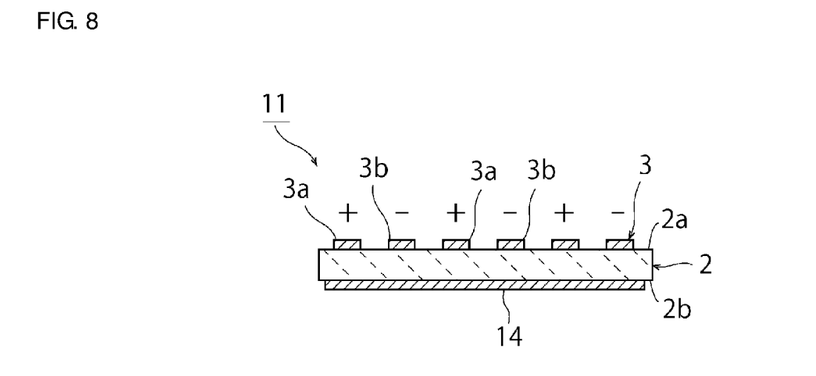
FIG. 8 is a schematic front sectional view of an elastic wave device according to a second preferred embodiment of the present invention.

FIG. 8 is a front sectional view of an elastic wave device according to a second preferred embodiment of the present invention. An elastic wave device 11 includes a LiNbO$_3$ substrate 2. An IDT electrode 3 is provided on a first main surface 2a of the LiNbO$_3$ substrate 2. The IDT electrode 3 includes a plurality of electrode fingers 3a and a plurality of electrode fingers 3b, just as with the IDT electrode 3 according to the first preferred embodiment. The IDT electrode 3 is preferably made of Al.

In the second preferred embodiment, an electrode film 14 is provided on a second main surface 2b of the LiNbO$_3$ substrate 2. In a plane view from the side of the first main surface 2a, the electrode film 14 has a structure that includes outer edges of electrode fingers crossing portions of the first IDT electrode 3. The electrode film 14 is used as a floating electrode.

The IDT electrode 3 and the electrode film 14 may be each made of an alloy having Al as a main constituent, instead of Al. The IDT electrode 3 and the electrode film 14 may each have a multilayer structure of an Al film and another metal film. Furthermore, the electrode film 14 may be made of a metal such as Ti, Au, Ni, or Cr, or a conductive compound such as ZnO or ITO.

In the elastic wave device 11 according to the second preferred embodiment, the application of alternating voltage to the first IDT electrode 3 excites plate waves of a high order mode in which SH waves predominate. Also in this preferred embodiment, the use of the plate waves of the high order mode in which the SH waves predominate allows a high acoustic velocity and a wide bandwidth.

Figure 9:
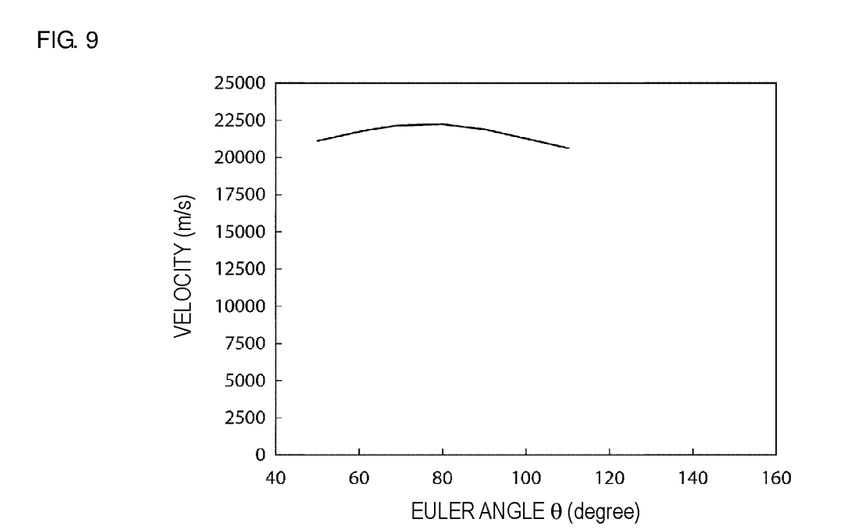
FIG. 9 is a graph showing the relationship between an Euler angle $\theta$ and the acoustic velocity of SH waves in a first order mode in the elastic wave device according to the second preferred embodiment of the present invention.

FIG. 9 is a graph that shows variations in the acoustic velocity of the SH waves in the first order mode, when varying θ of the Euler angles (0°, θ, 0°) of the LiNbO$_3$ substrate. Here, the thickness of the LiNbO$_3$ substrate 2 was set at about 0.1λ, where λ represented a wavelength determined by the pitch of the electrode fingers. The IDT electrode 3 had a film thickness of about 0.01λ and a duty of about 0.3. The electrode film 14 had a film thickness of about 0.01λ. As is apparent from FIG. 9, a high acoustic velocity of about 20000 m/second or more is realized when the Euler angle θ is between about 50° and about 110° inclusive.

Figure 10:
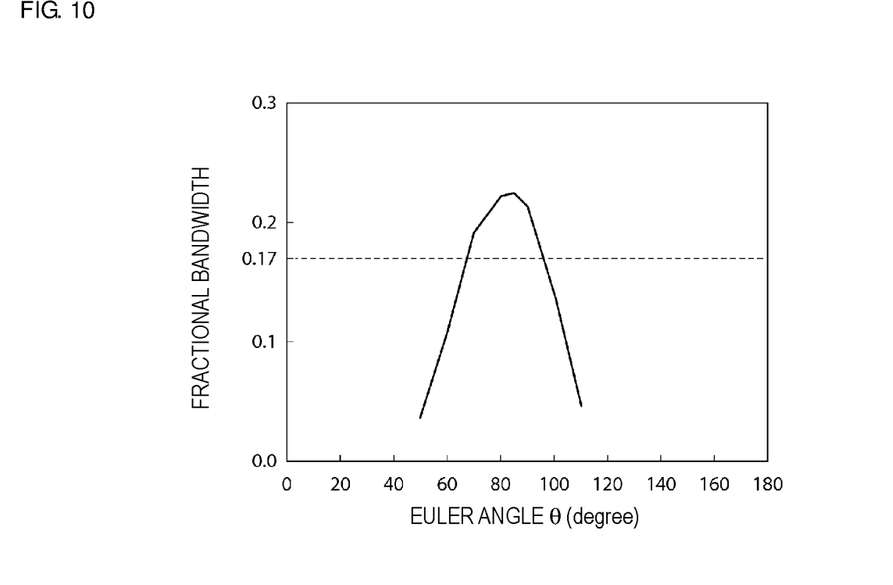
FIG. 10 is a graph showing the relationship between the Euler angle $\theta$ and a fractional bandwidth in the elastic wave device according to the second preferred embodiment of the present invention.

FIG. 10 is a graph showing the relationship between the Euler angle θ and a fractional bandwidth in the elastic wave device having the same structure as above described. Here, the fractional bandwidth refers to the fraction, that is, the difference in frequency between an anti-resonant frequency and a resonant frequency is divided by the resonant frequency in a surface acoustic wave resonator.

As is apparent from FIG. 10, when the Euler angle θ is about 68° or more and about 96° or less, the fractional bandwidth is about 0.17 or more, that is, about 17% or more.

Note that, the same effect is able to be obtained within the confines of $\phi=0\pm5°$ and $\psi=0\pm5°$. Therefore, it was discovered and confirmed that an Euler angle $\theta$ of about 68° or more and about 96° or less, as described above, allows a wide bandwidth. The Euler angle $\theta$ is more preferably about 72° or more and about 92° or less. In this case, the fractional bandwidth is able to be about 20% or more.

Figure 11:
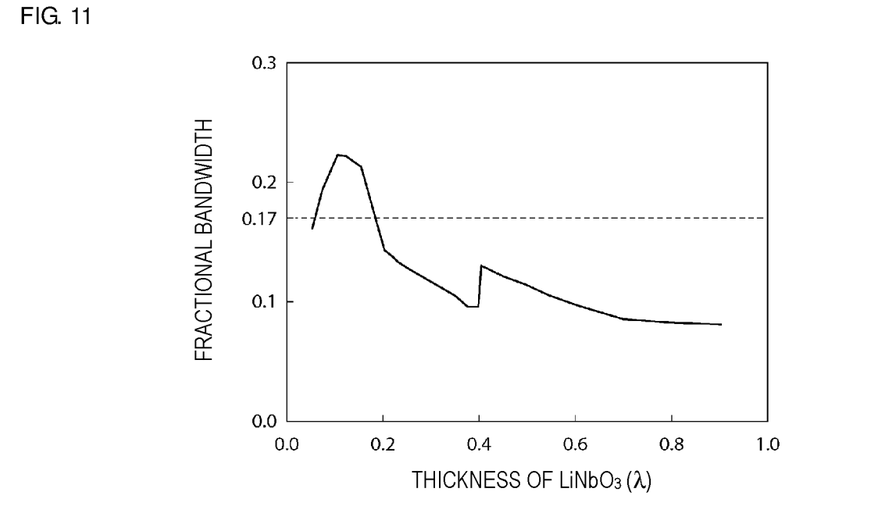
FIG. 11 is a graph showing the relationship between the thickness ($\times\lambda$) of a $LiNbO_3$ substrate and the fractional bandwidth in the elastic wave device according to the second preferred embodiment of the present invention.

FIG. 11 is a graph showing the relationship between the thickness (×λ) of the above LiNbO$_3$ substrate 2 and the fractional bandwidth. Note that, the Euler angles were here set at (0°, 83°, 0°). The IDT electrode 3 had a film thickness of about 0.01λ and a duty of about 0.3. The electrode film 14 had a film thickness of about 0.01λ.

As is apparent from FIG. 11, when the thickness of the LiNbO$_3$ substrate 2 is about 0.05λ or more and about 0.18λ or less, the fractional bandwidth can be about 0.17 or more, that is, about 17% or more. The thickness of the LiNbO$_3$ substrate 2 is more preferably 0.07λ or more and 0.16λ or less. In this case, the fractional bandwidth can be about 20% or more.

Figure 12:
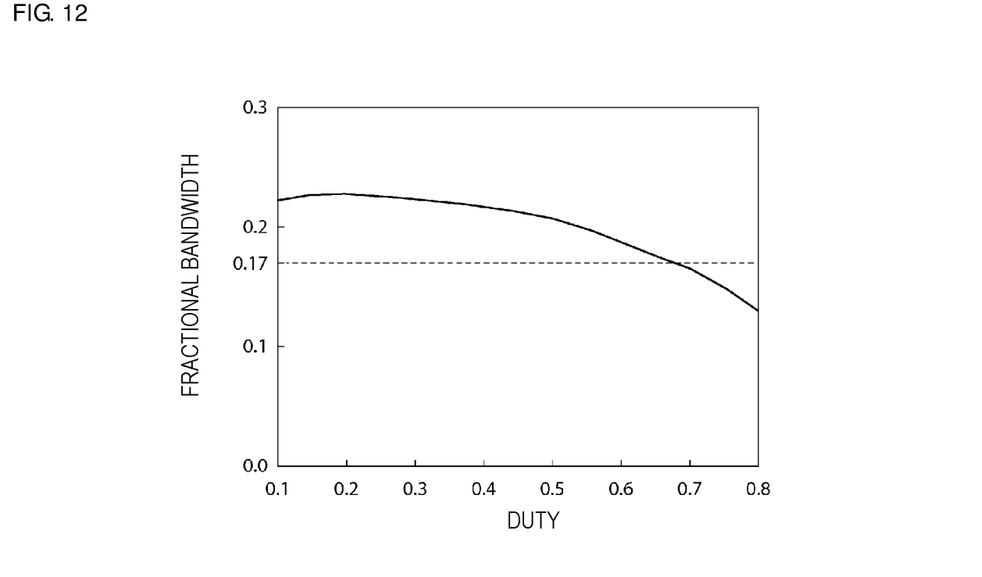
FIG. 12 is a graph showing the relationship between the duty of an IDT electrode and the fractional bandwidth in the elastic wave device according to the second preferred embodiment of the present invention.

FIG. 12 is a graph showing the relationship between the duty of the IDT electrode and the fractional bandwidth. Here, the LiNbO$_3$ substrate had Euler angles of (0°, 83°, 0°), and a thickness of about 0.1λ. The IDT electrodes were made of an Al film and had a thickness of about 0.01λ. The electrode film 14 had a film thickness of about 0.01λ.

As is apparent from FIG. 12, the duty is preferably set at about 0.1 or more and about 0.68 or less. Thus, the fractional bandwidth can be certainly about 0.17 or more, that is, about 17% or more.

Figure 13:
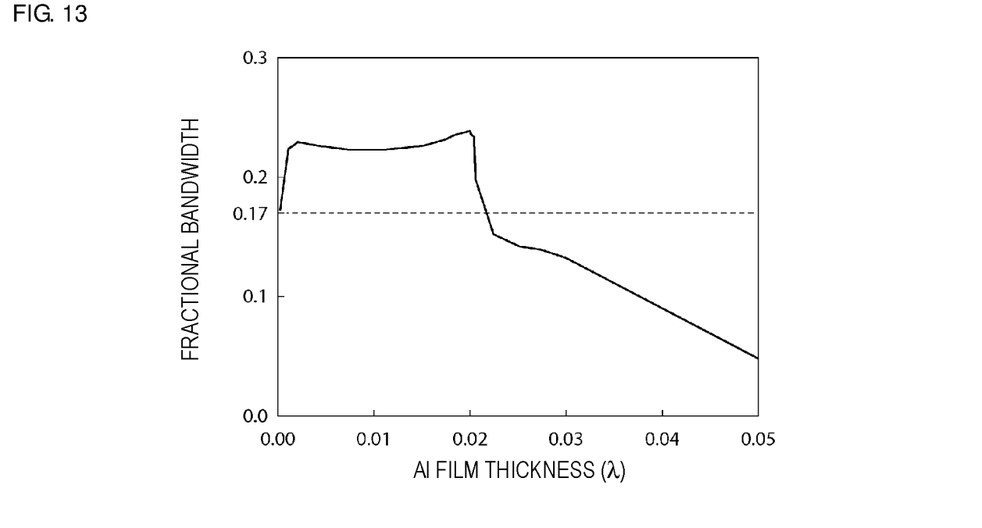
FIG. 13 is a graph showing the relationship between the film thickness ($\times\lambda$) of an Al film constituting the IDT electrode and the fractional bandwidth in the elastic wave device according to the second preferred embodiment of the present invention.

FIG. 13 is a graph showing the relationship between the thickness (λ) of the IDT electrode 3 made of Al and the fractional bandwidth. Here, the LiNbO$_3$ substrate had Euler angles of (0°, 83°, 0°), and a thickness of about 0.1λ. The duty of the IDT electrode 3 was about 0.3.

As is apparent from FIG. 13, the film thickness of Al is preferably about 0.022λ or less. In this case, the fractional bandwidth can be about 0.17 or more, that is, about 17% or more.

The preferred embodiments of the present invention describe the surface acoustic wave resonators, but the elastic wave device according to the present invention is not limited to surface acoustic wave resonators. Preferred embodiments of the present invention are widely applicable to surface acoustic wave filters including a plurality of IDT electrodes and various elastic wave devices. Thus, the number of the IDT electrodes is not specifically limited.

Note that, the Euler angles ($\phi$, $\theta$, $\psi$) may be equivalent crystallographic orientations.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a LiNbO$_3$ substrate including a first main surface and a second main surface on an opposite side of the first main surface;
   a first IDT electrode provided on the first main surface of the LiNbO$_3$ substrate; and
   a second IDT electrode provided on the second main surface of the LiNbO$_3$ substrate so as to be opposed to the first IDT electrode across the LiNbO$_3$ substrate; wherein
   a plate wave in a high order mode in which an SH wave predominates is excited in the LiNbO$_3$ substrate as an elastic wave in response to alternating voltages of reversed phases to each other being applied to the first IDT electrode and the second IDT electrode.

2. The elastic wave device according to claim 1, wherein in Euler angles ($\phi$, $\theta$, $\psi$) of the LiNbO$_3$ substrate, $\phi=0\pm5°$, $\psi=0\pm5°$, and $\theta$ is about 72° or more and about 97° or less.

3. The elastic wave device according to claim 1, wherein a thickness of the LiNbO$_3$ substrate is about 0.05λ or more and about 0.52λ or less, and λ represents a wavelength determined by a pitch of electrode fingers of the first and second IDT electrodes.

4. The elastic wave device according to claim 1, wherein a duty of each of the first and second IDT electrodes is about 0.15 or more and about 0.77 or less.

5. The elastic wave device according to claim 1, wherein the first and second IDT electrodes each include an electrode film made of Al or an alloy having Al as a main constituent, and a film thickness of each of the electrode films is about 0.035λ or less, and λ represents a wavelength determined by a pitch of electrode fingers of the first and second IDT electrodes.

6. The elastic wave device according to claim 1, wherein a fractional bandwidth of the elastic wave device is 17% or more.

7. The elastic wave device according to claim 1, wherein a fractional bandwidth of the elastic wave device is 20% or more.

8. An elastic wave device comprising:
   a LiNbO$_3$ substrate including a first main surface and a second main surface on an opposite side of the first main surface;
   an IDT electrode provided on the first main surface of the LiNbO$_3$ substrate; and
   an electrode film provided on the second main surface of the LiNbO$_3$ substrate so as to occupy an entire area enclosed with outer edges of the IDT electrode in a plan view from a side of the first main surface; wherein
   a plate wave in a high order mode in which an SH wave predominates is excited in the LiNbO$_3$ substrate as an elastic wave in response to an alternating voltage being applied to the IDT electrode.

9. The elastic wave device according to claim 8, wherein in Euler angles ($\phi$, $\theta$, $\psi$) of the LiNbO$_3$ substrate, $\phi=0\pm5°$, $\psi=0\pm5°$, and $\theta$ is about 68° or more and about 96° or less.

10. The elastic wave device according to claim 8, wherein a thickness of the LiNbO$_3$ substrate is about 0.05λ or more and about 0.18λ or less, and λ represents a wavelength determined by a pitch of electrode fingers of the IDT electrode.

11. The elastic wave device according to claim 8, wherein a duty of the IDT electrode is about 0.1 or more and about 0.68 or less.

12. The elastic wave device according to claim 8, wherein the IDT electrode includes an electrode film made of Al or an alloy having Al as a main constituent, and a film thickness of the electrode film is about 0.022λ or less, and λ represents a wavelength determined by a pitch of electrode fingers of the IDT electrode.

13. The elastic wave device according to claim 8, wherein the electrode film defines a floating electrode.

14. The elastic wave device according to claim 8, wherein the electrode film is made of one of Ti, Au, Ni, Cr, and a conductive compound including one of ZnO and ITO.

15. The elastic wave device according to claim 8, wherein a fractional bandwidth of the elastic wave device is 17% or more.

16. The elastic wave device according to claim 8, wherein a fractional bandwidth of the elastic wave device is 20% or more.

17. The elastic wave device according to claim 8, wherein a thickness of the $LiNbO_3$ substrate is about $0.07\lambda$ or more and about $0.16\lambda$ or less, and $\lambda$ represents a wavelength determined by a pitch of electrode fingers of the IDT electrode.

\* \* \* \* \*